United States Patent
Yun et al.

(10) Patent No.: US 12,389,736 B2
(45) Date of Patent: Aug. 12, 2025

(54) ORGANIC PHOTODIODE, SENSOR, CAMERA, AND ELECTRONIC DEVICE

(71) Applicant: Samsung Electronics Co., Ltd., Suwon-si (KR)

(72) Inventors: Sung Young Yun, Suwon-si (KR); Kyung Bae Park, Hwaseong-si (KR); Chul Joon Heo, Busan (KR); Feifei Fang, Suwon-si (KR); Hwijoung Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 443 days.

(21) Appl. No.: 17/851,775

(22) Filed: Jun. 28, 2022

(65) Prior Publication Data
US 2023/0036360 A1 Feb. 2, 2023

(30) Foreign Application Priority Data

Jul. 30, 2021 (KR) .................. 10-2021-0100946

(51) Int. Cl.
*H01L 51/44* (2006.01)
*H10K 30/87* (2023.01)
(Continued)

(52) U.S. Cl.
CPC ............. *H10K 30/87* (2023.02); *H10K 39/32* (2023.02); *H10K 30/82* (2023.02)

(58) Field of Classification Search
CPC ........ H10K 30/87; H10K 39/32; H10K 30/82; H10K 2102/351; H10K 30/00; H10K 30/451; Y02E 10/549; H01L 2031/0344
See application file for complete search history.

(56) References Cited

U.S. PATENT DOCUMENTS 10,297,703 B2   5/2019 Tian et al.
2018/0108846 A1* 4/2018 Lunt, III ............... H10K 71/30
(Continued)

FOREIGN PATENT DOCUMENTS

JP      2020-021848 A    2/2020
KR    2014-0140038 A    12/2014
(Continued)

OTHER PUBLICATIONS

Visible-blind ultraviolet narrowband photomultiplication-type organic photodetector with an ultrahigh external quantum efficiency of over 1 000 000%, Mater. Horiz., Jun. 17, 2021, 8, 2293-230 (Year: 2021).*

(Continued)

*Primary Examiner* — Jarrett J Stark
(74) *Attorney, Agent, or Firm* — Harness, Dickey & Pierce, P.L.C.

(57) ABSTRACT

An organic photodiode includes a first electrode including a reflective layer, a second electrode including a semi-transmissive layer, a photoelectric conversion layer between the first electrode and the second electrode and including an organic light absorbing material, and a buffer layer that is at least one of between the reflective layer and the photoelectric conversion layer or between the semi-transmissive layer and the photoelectric conversion layer. The organic photodiode is configured to exhibit at least three external quantum efficiency (EQE) spectra in a wavelength region of about 380 nm to about 3000 nm and each EQE spectrum of the at least three EQE spectra has a full width at half maximum of about 2 nm to about 100 nm.

20 Claims, 14 Drawing Sheets

(51) Int. Cl.
  *H10K 39/32* (2023.01)
  *H10K 30/82* (2023.01)

(56) References Cited

U.S. PATENT DOCUMENTS

| | | | |
|---|---|---|---|
| 2018/0294376 A1 | 10/2018 | Tian et al. | |
| 2020/0227642 A1 | 7/2020 | Yaacobi-Gross | |
| 2021/0305522 A1 | 9/2021 | Ferrara et al. | |
| 2023/0403929 A1* | 12/2023 | Kishimoto | C07F 7/0834 |
| 2024/0292641 A1* | 8/2024 | Ujiie | H10K 85/633 |

FOREIGN PATENT DOCUMENTS

| | | | |
|---|---|---|---|
| KR | 2016-0075335 A | 6/2016 | |
| KR | 2017-0038397 A | 4/2017 | |
| KR | 2017-0137933 A | 12/2017 | |
| KR | 2019-0053234 A | 5/2019 | |

OTHER PUBLICATIONS

Pettersson et al. "Modeling photocurrent action spectra of photovoltaic devices based on organic thin films", Journal of Applied Physics 86, 487 (1999).

Korean Office Action dated Jul. 2, 2025 for corresponding Korean Application No. 10-2021-0100946, and English-language translation thereof.

* cited by examiner

ORGANIC PHOTODIODE, SENSOR, CAMERA, AND ELECTRONIC DEVICE

CROSS-REFERENCE TO RELATED APPLICATION

This application claims priority to and the benefit of Korean Patent Application No. 10-2021-0100946 filed in the Korean Intellectual Property Office on Jul. 30, 2021, the entire contents of which are incorporated herein by reference.

BACKGROUND

1. Field

Organic photodiodes, sensors, cameras, and electronic devices are disclosed.

2. Description of the Related Art

Silicon photodiodes may be configured to absorb light in a broad wavelength spectrum and convert the absorbed light into an electrical signal, and may be used along with color filters to select light in a particular (or, alternatively, predetermined) wavelength spectrum.

Since the organic material is configured to selectively absorb light of a particular (or, alternatively, predetermined) wavelength spectrum according to a molecular structure, an organic photodiode having wavelength selectivity may be manufactured without a separate color filter.

SUMMARY

Since the absorption spectrum of an organic photodiode is determined by inherent light absorption characteristics of organic materials, it may be generally expressed as a single absorption spectrum, and the photoelectric conversion characteristics of the organic photodiode may also appear as a profile similar to a single absorption spectrum of an organic material.

Some example embodiments provide an organic photodiode capable of exhibiting photoelectric conversion characteristics different from an absorption spectrum of an organic material.

Some example embodiments provide a sensor including the organic photodiode.

Some example embodiments provide a camera including the organic photodiode or the sensor.

Some example embodiments provide an electronic device including the organic photodiode, the sensor, or the camera.

According to some example embodiments, an organic photodiode may include a first electrode including a reflective layer, a second electrode including a semi-transmissive layer, a photoelectric conversion layer between the first electrode and the second electrode and including an organic light absorbing material, and a buffer layer that is at least one of between the reflective layer and the photoelectric conversion layer or between the semi-transmissive layer and the photoelectric conversion layer, wherein the organic photodiode is configured to exhibit at least three external quantum efficiency (EQE) spectra in a wavelength region of about 380 nm to about 3000 nm and each EQE spectrum of the at least three EQE spectra has a full width at half maximum of about 2 nm to about 100 nm.

Each EQE spectrum of the at least three EQE spectra may have an EQE peak, adjacent EQE spectra of the at least three EQE spectra may intersect at a boundary, and an EQE at the boundary may be about 0% to about 5% of the EQE peak.

Each EQE spectrum of the at least three EQE spectra may have a separate EQE peak, and an interval between adjacent EQE peaks of adjacent EQE spectra of the at least three EQE spectra may be about 1 nm to about 200 nm.

A quantity of EQE spectra of the at least three EQE spectra may be at least partially defined by a thickness of the buffer layer, and as the thickness of the buffer layer increases, the quantity of EQE spectra of the at least three EQE spectra may increase.

The buffer layer may include a first buffer layer between the reflective layer and the photoelectric conversion layer, a quantity of EQE spectra of the at least three EQE spectra may be at least partially defined by a thickness of the first buffer layer, and as the thickness of the first buffer layer increases, the quantity of EQE spectra of the at least three EQE spectra may increase.

The thickness of the first buffer layer may be about 10 times to about 1000 times a thickness of the photoelectric conversion layer.

The thickness of the first buffer layer may be about 400 nm to about 50 μm.

The buffer layer may further include a second buffer layer that is between the semi-transmissive layer and the photoelectric conversion layer.

An absorption spectrum of the photoelectric conversion layer may be a single absorption spectrum belonging to a red wavelength region, a green wavelength region, a blue wavelength region, an infrared wavelength region, or any combination thereof.

Each EQE spectrum of the at least three EQE spectra may belong to a wavelength region of about 380 nm to about 800 nm.

The at least three EQE spectra may include at least one first EQE spectrum having a first EQE peak in a first wavelength region of greater than or equal to about 380 nm and less than about 500 nm, at least one second EQE spectrum having a second EQE peak in a second wavelength region of about 500 nm to about 600 nm, and at least one third EQE having a third EQE peak in a third wavelength region greater than about 600 nm and less than or equal to 800 nm.

At least a portion of the at least three EQE spectra may exhibit an EQE of about 40% to about 100%.

According to some example embodiments, an organic photodiode includes a first electrode and a second electrode facing each other, and a photoelectric conversion layer between the first electrode and the second electrode and including an organic light absorbing material, wherein the first electrode includes a reflective layer, the second electrode includes a semi-transmissive layer, the photoelectric conversion layer is configured to exhibit a single absorption spectrum within a visible light wavelength region, and the organic photodiode is configured to exhibit at least three external quantum efficiency (EQE) spectra that are separated from each other and are distributed in the visible light wavelength region.

A quantity of EQE spectra of the at least three EQE spectra may be at least partially defined by an interval between the reflective layer and the semi-transmissive layer, and as the interval between the reflective layer and the semi-transmissive layer becomes larger, the quantity of the EQE spectra may increase.

The organic photodiode may further include a buffer layer disposed between at least one of between the reflective layer and the photoelectric conversion layer or between the semi-transmissive layer and the photoelectric conversion layer, an interval between the reflective layer and the semi-transmissive layer may be at least partially defined by a thickness of the buffer layer, and the thickness of the buffer layer may be about 10 times to about 1000 times a thickness of the photoelectric conversion layer.

The organic photodiode may further include a buffer layer disposed at least one of between the reflective layer and the photoelectric conversion layer or between the semi-transmissive layer and the photoelectric conversion layer, wherein the photoelectric conversion layer may have a thickness of about 5 nm to about 300 nm and the buffer layer may have a thickness of about 400 nm to about 50 μm.

The at least three EQE spectra may include at least one first EQE spectrum having a first EQE peak in a first wavelength region of greater than or equal to about 380 nm and less than about 500 nm, at least one second EQE spectrum having a second EQE peak in a second wavelength region of about 500 nm to about 600 nm, and at least one third EQE having a third EQE peak in a third wavelength region greater than about 600 nm and less than or equal to 800 nm.

According to some example embodiments, an organic photodiode may include a first electrode and a second electrode facing each other, and a photoelectric conversion layer between the first electrode and the second electrode. The photoelectric conversion layer may include an organic light absorbing material. The photoelectric conversion layer may be configured to exhibit a single absorption spectrum within a visible light wavelength region. The organic photodiode may be configured to exhibit at least three external quantum efficiency (EQE) spectra that are separated from each other and are distributed in the visible light wavelength region.

The first electrode may include a reflective layer. The second electrode may include a semi-transmissive layer.

The organic photodiode may further include a buffer layer that is at least one of between the first electrode and the photoelectric conversion layer, or between the second electrode and the photoelectric conversion layer.

The organic photodiode may be configured to exhibit the at least three EQE spectra in a wavelength region of about 380 nm to about 3000 nm. Each EQE spectrum of the at least three EQE spectra may have a full width at half maximum (FWHM) of about 2 nm to about 100 nm.

According to some example embodiments, a sensor including the organic photodiode is provided.

The sensor may be a multi spectral image sensor or a hyperspectral image sensor.

According to some example embodiments, a camera including the sensor is provided.

According to some example embodiments, an electronic device including the sensor or the camera is provided.

An organic photodiode capable of exhibiting a photoelectric conversion characteristic different from the absorption spectrum of an organic material may be implemented.

DETAILED DESCRIPTION

Figure 1:
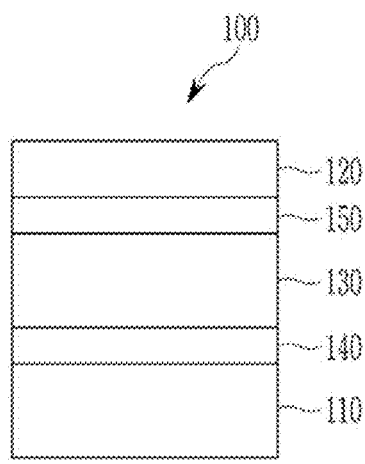
FIG. 1 is a cross-sectional view showing an example of an organic photodiode according to some example embodiments.

Hereinafter, some example embodiments of the present inventive concepts will be described in detail so that a person skilled in the art would understand the same. This inventive concepts may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

In the drawings, parts having no relationship with the description are omitted for clarity of the embodiments, and the same or similar constituent elements are indicated by the same reference numeral throughout the specification.

Hereinafter, the terms "lower" and "upper" are used for better understanding and ease of description, but do not limit the location relationship.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

As used herein, when a definition is not otherwise provided, "hetero" refers to one including 1 to 4 heteroatoms selected from N, O, S, Se, Te, Si, and P.

As used herein, when a definition is not otherwise provided, the energy level is the highest occupied molecular orbital (HOMO) energy level or the lowest unoccupied molecular orbital (LUMO) energy level.

As used herein, when a definition is not otherwise provided, a work function or energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level. In addition, a difference between the work function and/or the energy level may be a value obtained by subtracting a small value of the absolute value from a large value of the absolute value.

Hereinafter, an organic photodiode according to some example embodiments is described.

Figure 2:
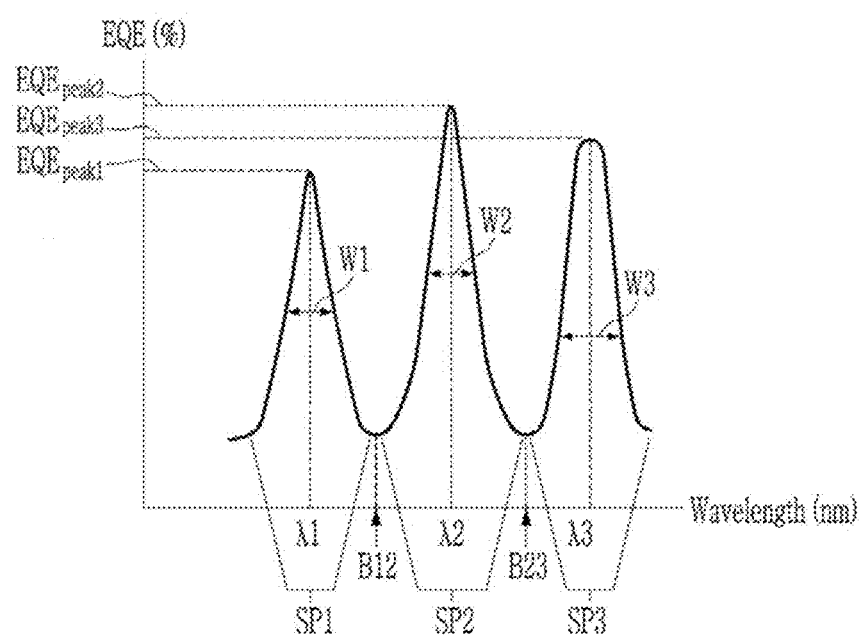
FIG. 2 is an example of an external quantum efficiency spectrum of the organic photodiode of FIG. 1.

FIG. 1 is a cross-sectional view showing an example of an organic photodiode according to some example embodiments, and FIG. 2 is an example of an external quantum efficiency spectrum of (e.g., exhibited by) the organic photodiode of FIG. 1.

Referring to FIG. 1, an organic photodiode 100 according to some example embodiments includes a first electrode 110, a second electrode 120, and a photoelectric conversion layer 130 between the first electrode 110 and the second electrode 120, and buffer layers 140 and 150. In some example embodiments, one of the buffer layers 140 and 150 may be omitted from the organic photodiode 100.

One of the first electrode 110 or the second electrode 120 is an anode and the other is a cathode. For example, the first electrode 110 may be an anode and the second electrode 120 may be a cathode. For example, the first electrode 110 may be a cathode and the second electrode 120 may be an anode. The second electrode 120 may be an incident electrode disposed in a direction in which light is incident.

The first electrode 110 may be a reflective electrode including a reflective layer. The reflective layer may have high reflectance and low light transmittance. For example, the reflective layer may have a reflectance of about 10% to about 100%, about 20% to about 100%, about 30% to about 100%, about 50% to about 100%, about 70% to about 100%, about 80% to about 100%, about 90% to about 100%, about 95% to about 100%, about 98% to about 100% or about 99% to about 100%, and may have a light transmittance of greater than or equal to about 0% and less than about 10%, about 0% to about 8%, about 0% to about 7%, about 0% to about 5%, about 0% to about 3%, or about 0% to about 1%. The reflective layer may include an optically opaque material, for example, a metal, a metal nitride, or any combination thereof, for example, silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto. The reflective layer may be one layer or two or more layers. The reflective layer may form a microcavity together with a semi-transmissive layer, which will be described later, to control electrical characteristics of the organic photodiode 100. This will be described later.

The first electrode 110 may further include a light-transmitting auxiliary layer (not shown) on and/or under the reflective layer, in addition to the reflective layer. The light-transmitting auxiliary layer may have a relatively high light transmittance of, for example, about 80% to about 100%, about 85% to about 100%, about 88% to about 100%, or about 90% to about 100%. The light-transmitting auxiliary layer may include an optically transparent conductor, and for example, may include at least one of an oxide conductor, a carbon conductor, or a metal thin film. The oxide conductor may include one or more selected from, for example, indium tin oxide (ITO), indium zinc oxide (IZO), zinc tin oxide (ZTO), aluminum tin oxide (ATO) and aluminum zinc oxide (AZO), the carbon conductor may include at least one selected from graphene and carbon nanostructure, and the metal thin film may include, for example, a metal thin film formed to have a thin thickness of several nanometers to several tens of nanometers, or a single layer or a plurality of metal thin films formed to have a thin thickness of several nanometers to several tens of nanometers doped with metal oxide.

The thickness of the first electrode 110 may be, for example, about 10 nm to about 3 µm, and within the above range, about 20 nm to about 2 µm, about 50 nm to about 2 µm, or about 100 nm to about 1 µm.

The second electrode 120 may include a semi-transmissive layer. The semi-transmissive layer may have a light transmittance between the transparent layer and the reflective layer, and for example, may have a light transmittance of about 10% to about 70%, about 20% to about 60%, or about 30% to about 50%. The semi-transmissive layer may be configured to selectively transmit light in a particular (or, alternatively, predetermined) wavelength region and reflect or absorb light in other wavelength regions. The semi-transmissive layer may include, for example, a relatively thin metal layer or alloy layer having a thickness of about 5 nm to about 40 nm, and may include, for example, silver (Ag), copper (Cu), aluminum (Al), magnesium (Mg), magnesium-silver (Mg—Ag), magnesium-aluminum (Mg—Al), or any combination thereof, but is not limited thereto. The semi-transmissive layer may have a thickness, for example, less than or equal to about 80 nm, less than or equal to about 70 nm, less than or equal to about 60 nm, less than or equal to about 50 nm, or less than or equal to about 40 nm, within the above range, about 5 nm to about 80 nm, about 5 nm to about 70 nm, about 5 nm to about 60 nm, about 5 nm to about 50 nm, about 5 nm to about 40 nm, about 10 nm to about 80 nm, about 10 nm to about 70 nm, about 10 nm to about 60 nm, about 10 nm to about 50 nm, about 10 nm to about 40 nm, about 20 nm to about 80 nm, about 20 nm to about 70 nm, about 20 nm to about 60 nm, about 20 nm to about 50 nm, or about 20 nm to about 40 nm but is not limited thereto. The semi-transmissive layer may form a microcavity together with the aforementioned reflective layer to control electrical characteristics of the organic photodiode 100. This will be described later.

The second electrode 120 may further include a light-transmitting auxiliary layer (not shown) on and/or under the semi-transmissive layer, in addition to the semi-transmissive layer. The light-transmitting auxiliary layer is the same as described above.

The second electrode 120 may have a thickness of, for example, about 5 nm to about 1 µm, or within the above range, about 5 nm to about 800 nm, about 5 nm to about 600 nm, or about 5 nm to about 500 nm.

The photoelectric conversion layer 130 may be configured to absorb light of a particular (or, alternatively, predetermined) wavelength region and convert the absorbed light into an electrical signal.

The photoelectric conversion layer 130 may be configured to selectively absorb at least a portion of light in a wavelength range corresponding to visible light to infrared light and convert the absorbed light into an electrical signal, and for example, it may be configured to selectively absorb at least a portion of light in a wavelength range of about 380 nm to about 3000 nm and convert the absorbed light into an electrical signal. The photoelectric conversion layer 130 may be configured to selectively absorb, for example, light of a red wavelength region (hereinafter, referred to as "red light"), light of a green wavelength region (hereinafter, referred to as "green light"), light of a blue wavelength region (hereinafter, referred to as "blue light").), light in the infrared wavelength region (hereinafter, referred to as "infrared light"), or any combination thereof, and convert the absorbed light into an electrical signal. For example, the photoelectric conversion layer 130 may be configured to selectively absorb the light of red light, green light, blue light, or any combination thereof and convert into an electrical signal.

The photoelectric conversion layer 130 may be an organic photoelectric conversion layer including an organic light absorbing material. The organic light absorbing material may be, for example, a non-polymer such as low molecular weight compound, a polymer, or any combination thereof. The organic light absorbing material may be a semiconductor, for example, a p-type semiconductor or an n-type semiconductor.

For example, the organic light absorbing material may be a wavelength-selective material having a maximum absorption wavelength ($\lambda_{max}$) in a wavelength region of greater than or equal to about 380 nm and less than about 500 nm, for example, a wavelength-selective material having a maximum absorption wavelength ($\lambda_{max}$) in a wavelength region of about 410 nm to about 480 nm.

For example, the organic light absorbing material may be a wavelength-selective material having a maximum absorption wavelength ($\lambda_{max}$) in a wavelength region of about 500 nm to about 600 nm, for example, a wavelength-selective material having a maximum absorption wavelength ($\lambda_{max}$) in a wavelength region of about 520 nm to about 580 nm.

For example, the organic light absorbing material may be a wavelength-selective material having a maximum absorption wavelength ($\lambda_{max}$) in a wavelength region greater than about 600 nm and less than or equal to about 800 nm, for example, a wavelength-selective material having a maximum absorption wavelength ($\lambda_{max}$) in a wavelength region of about 610 nm to about 690 nm.

In some example embodiments, the organic light absorbing material may include a quantum dot, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole) compound, a boron-dipyrromethene compound, a nickel-dithiol complex compound, a croconium compound, a derivative thereof, or any combination thereof, but is not limited thereto.

The organic light absorbing material may include a compound represented by Chemical Formula 1.

[Chemical Formula 1]

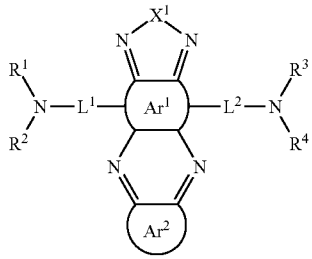

In Chemical Formula 1, $Ar^1$ is a substituted or unsubstituted C6 to C30 aromatic ring, a substituted or unsubstituted C3 to C30 heteroaromatic ring, or a combination thereof, $Ar^2$ is a substituted or unsubstituted C6 to C30 aromatic ring, a substituted or unsubstituted C3 to C30 heteroaromatic ring, or a combination thereof, $X^1$ is O, S, Se, Te, S(=O), S(=O$_2$), NR$^a$, CR$^b$R$^c$, or SiR$^d$R$^e$ (wherein R$^a$, R$^b$, R$^c$, R$^d$, and R$^e$ are independently hydrogen, a C1 to C6 alkyl group, a C1 to C6 haloalkyl group, a C6 to C12 aryl group, a C3 to C12 heteroaryl group, a halogen, a cyano group, or a combination thereof), $L^1$ and $L^2$ are independently a substituted or unsubstituted C3 to C20 heteroarylene group, or a fused ring of a substituted or unsubstituted C6 to C20 arylene group and a substituted or unsubstituted C3 to C20 heteroarylene group, $R^1$, $R^2$, $R^3$, and $R^4$ are independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C3 to C30 heteroaryl group, a substituted or unsubstituted silyl group, a halogen, or a combination thereof, and $R^1$ and $R^2$ may independently be present or be linked to each other to form a ring, and $R^3$ and $R^4$ may independently be present or be linked to each other to form a separate ring.

The photoelectric conversion layer 130 may further include a counter material capable of forming a pn junction with the aforementioned organic light absorbing material. For example, when the organic light absorbing material is a p-type semiconductor, the counter material may be an n-type semiconductor. For example, when the organic light absorbing material is an n-type semiconductor, the counter material may be a p-type semiconductor. The counter material may be, for example, an organic material, an inorganic material, an organic-inorganic material, or any combination thereof, and may be, for example, a light absorbing material or a non-light absorbing material. The counter material may include, but is not limited to, for example, fullerenes or fullerene derivatives. The photoelectric conversion layer 130 may generate excitons from incident light by the pn junction of the organic light absorbing material and the counter material, and then separate the generated excitons into holes and electrons.

The photoelectric conversion layer 130 may be and/or include an intrinsic layer (I layer) in which an organic light absorbing material and a counter material are blended in a bulk heterojunction form. In this case, the p-type semiconductor and the n-type semiconductor may be blended in a volume ratio (thickness ratio) of about 1:9 to about 9:1, and within the above range, for example, about 2:8 to about 8:2, for example, about 3:7 to about 7:3, for example, about 4:6 to about 6:4, for example, about 5:5.

The photoelectric conversion layer 130 may include a bi-layer including a p-type layer including the aforementioned p-type semiconductor and an n-type layer including the aforementioned n-type semiconductor. In this case, a thickness ratio of the p-type layer and the n-type layer may be about 1:9 to about 9:1, and within the above range, for example, about 2:8 to about 8:2, about 3:7 to about 7:3, about 4:6 to about 6:4, or about 5:5.

The photoelectric conversion layer 130 may further include a p-type layer and/or an n-type layer in addition to the I layer. The p-type layer may include the aforementioned p-type semiconductor, and the n-type layer may include the aforementioned n-type semiconductor. For example, they may be included in various combinations such as p-type layer/I-layer, I-layer/n-type layer, p-type layer/I-layer/n-type layer, and the like.

The light absorption characteristics of the photoelectric conversion layer 130 may be expressed by a combination of the light absorption characteristics of the aforementioned organic light absorption material and the light absorption characteristic of the counter material. For example, the organic light absorbing material and the counter material may each be light absorbing materials, and the absorption spectrum of the organic light absorbing material and the absorption spectrum of the counter material may each independently be a single absorption spectrum belonging to (e.g., within) a red wavelength region, a green wavelength region, a blue wavelength region, an infrared wavelength region, or any combination thereof. The absorption spectrum of the photoelectric conversion layer 130 may be a combination of the absorption spectrum of the organic light absorbing material and the absorption spectrum of the counter material, and may be a single absorption spectrum having a wider full width at half maximum than the absorption spectrum of the organic light absorbing material or the absorption spectrum of the counter material. For example, when the absorption spectrum of the organic light absorbing material belongs to the green wavelength region and the absorption spectrum of the counter material belongs to the blue wavelength region, the absorption spectrum of the photoelectric conversion layer 130 may belong to the blue to green wavelength region. Herein, the absorption spectrum of the photoelectric conversion layer 130 may be measured in a thin film state, and may be, for example, measured from the absorbance of a thin film of a particular (or, alternatively, predetermined) thickness (e.g., about 10 nm to about 300 nm) formed from the organic light absorbing material and the counter material by deposition such as thermal evaporation or vacuum deposition or coating such as spin coating or inkjet coating.

A thickness of the photoelectric conversion layer 130 may be, for example, about 5 nm to 300 nm, or within the above range, about 5 nm to 200 nm. Within the above thickness range, photoelectric conversion efficiency may be effectively improved by effectively absorbing light and effectively separating and transmitting holes and electrons.

The buffer layers 140 and 150 include the first buffer layer 140 between the first electrode 110 (reflective layer) and the photoelectric conversion layer 130 and a second buffer layer 150 between the second electrode 120 (semi-transmissive layer) and the photoelectric conversion layer 130.

The first buffer layer 140 and the second buffer layer 150 may each independently be a charge auxiliary layer for controlling mobility of holes and/or electrons separated from the photoelectric conversion layer 130, or a light-absorbing auxiliary layer for improving light absorption characteristics. For example, the first buffer layer 140 and the second buffer layer 150 may be one or more selected from a hole injecting layer (HIL), a hole transporting layer (HTL), a hole extraction layer (HEL), an electron blocking layer (EBL), an electron injecting layer (EIL), an electron transporting layer (ETL), an electron extraction layer (EEL), a hole blocking layer (HBL), and a light-absorbing auxiliary layer.

The first buffer layer 140 and the second buffer layer 150 may each independently include an organic material, an inorganic material, an organic-inorganic material, or any combination thereof. For example, the hole injection layer, the hole transport layer, and/or the electron blocking layer may be formed of, for example, a phthalocyanine compound such as copper phthalocyanine; DNTPD (N,N'-diphenyl-N, N'-bis-[4-(phenyl-m-tolyl-amino)-phenyl]-biphenyl-4,4'-diamine), m-MTDATA (4,4',4''-[tris(3-methylphenyl)phenylamino]triphenylamine), TDATA (4,4'4''-tris(N, Ndiphenylamino)triphenylamine), 2-TNATA (4,4',4''-tris {N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecyl benzene sulfonic acid), PANI/CSA (polyaniline/Camphor sulfonic acid), PANI/PSS (polyaniline/poly(4-styrenesulfonate)), NPB (N,N'-di(naphthalene-I-yl)-N,N'-diphenylbenzidine), triphenylamine polyether ketone (TPAPEK), 4-isopropyl-4'-methyldiphenyliodonium [tetrakis (pentafluorophenyl) borate], HAT-CN (dipyrazino [2,3-f: 2',3'-h]quinoxaline-2,3,6,7,10,11-hexacarbonitrile), N-phenylcarbazole, a carbazole derivatives such as polyvinylcarbazole, a fluorine derivative, a triphenylamine derivative such as TPD (N,N'-bis(3-methylphenyl)-N,N'-diphenyl-[1,1-biphenyl]-4,4'-diamine) and TCTA (4,4',4''-tris(N-carbazolyl)triphenylamine), NPB (N,N'-di(naphthalene-I-yl)-N,N'-diphenylbenzidine), TAPC (4,4'-cyclohexylidene) bis[N, N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto. The electron injection layer, the electron transport layer, and/or the hole blocking layer may include, for example, a metal halide such as LiF, NaCl, CsF, RbCl and RbI; a lanthanide metal such as Yb; a metal oxide such as $Li_2O$ and BaO; Liq (lithium quinolate), Alq3 (tris(8-hydroxyquinolinato)aluminum), 1,3,5-tri[(3-pyridyl)-phen-3-yl]benzene, 2,4,6-tris(3'-(pyridin-3-yl) biphenyl-3-yl)-1,3,5-triazine, 2-(4-(N-phenylbenzoimidazolyl-1-ylphenyl)-9,10-dinaphthylanthracene, TPBi (1,3,5-tri (1-phenyl-1H-benzo[d]imidazol-2-yl)phenyl), BCP (2,9-dimethyl-4,7-diphenyl-1,10-phenanthroline), Bphen (4,7-diphenyl)-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2)-methyl-8-quinolinolato-N1,O8)-(1,1'-biphenyl-4-olato)aluminum), Bebq2 (berylliumbis(benzoquinolin-10-olate), AND (9,10-di(naphthalene-2-yl) anthracene), BmPyPhB (1,3-Bis[3,5-di(pyridin-3-yl)phenyl]benzene), or any combination thereof but is not limited thereto. The light-absorbing auxiliary layer may be, for example, a fullerene or a fullerene derivative. Either one of the first buffer layer 140 and/or the second buffer layer 150 may be omitted.

The first buffer layer 140 and/or the second buffer layer 150 may be between the first electrode 110 (reflective layer) and the second electrode 120 (semi-transmissive layer) to adjust an optical length of the microcavity and thus to control the electrical characteristics of the organic photodiode 100.

Specifically, the organic photodiode 100 may form a microcavity structure by the first electrode 110 including a reflective layer and the second electrode 120 including a semi-transmissive layer. Incident light into the organic photodiode 100 may be repeatedly reflected between the reflective layer and the semi-transmissive layer spaced apart by a particular (or, alternatively, predetermined) optical length due to the microcavity structure, and a photoelectric conversion spectrum may be effectively controlled according to the optical length.

The photoelectric conversion characteristics of the organic photodiode 100 may be expressed as photoelectric conversion efficiency, and the photoelectric conversion efficiency may be in general evaluated from external quantum efficiency (EQE). The EQE may be a ratio of extracted charge carriers relative to incident photons. In other words, when the EQE is high in a particular (or, alternatively, predetermined) wavelength region, the photoelectric conversion characteristics may also be high in the particular (or, alternatively, predetermined) wavelength region, and a current may be effectively generated.

The EQE of the organic photodiode 100 according to a wavelength may be expressed by an EQE spectrum, and the EQE spectrum according to a wavelength may be a profile showing EQE according to a wavelength. In general, the EQE spectrum of the organic photodiode 100 may appear in a similar profile to an absorption spectrum of the photoelectric conversion layer 130.

The organic photodiode 100 according to some example embodiments may exhibit (e.g., may be configured to exhibit) a different EQE spectrum from the absorption spectrum of the photoelectric conversion layer 130 due to the above microcavity structure. The organic photodiode 100 may exhibit a plurality of EQE spectra having a narrow full width at half maximum (FWHM) unlike the single absorption spectrum of the photoelectric conversion layer 130. In other words, the EQE spectrum of the organic photodiode 100 may be expressed as a narrow multiband.

Referring to FIG. 2, the organic photodiode 100 may exhibit (e.g., may be configured to exhibit) at least three EQE spectra in a particular (or, alternatively, predetermined) wavelength region, and the particular (or, alternatively, predetermined) wavelength region may be, for example, visible to infrared wavelength regions (e.g., about 380 nm to about 3000 nm). Each of the EQE spectra SP1, SP2, and SP3 may have a narrow FWHM W1, W2, and W3, for example, the FWHM W1, W2, and W3 of each of the EQE spectra SP1, SP2, and SP3 may be narrower than a wavelength width obtained by dividing an entire wavelength region to which the EQE spectra belong by the number of the EQE spectra. For example, the FHWM W1, W2, and W3 of each of the EQE spectra SP1, SP2, and SP3 may be less than or equal to about 100 nm, for example, about 2 nm to about 100 nm, about 2 nm to about 90 nm, about 2 nm to about 80 nm, about 2 nm to about 70 nm, about 2 nm to about 60 nm, about 2 nm to about 50 nm, about 2 nm to about 40 nm, about 2 nm to about 30 nm, or about 2 nm to about 20 nm. Herein, each FWHM W1, W2, and W3 of the EQE spectra SP1, SP2, and SP3 may be a wavelength width corresponding to (e.g., equaling within a 10% margin) a half of each maximum value (peak) $EQE_{peak1}$, $EQE_{peak2}$, and $EQE_{peak3}$ of the EQE in the EQE spectra.

Each of the EQE spectra SP1, SP2, and SP3 may have EQE peaks $EQE_{peak1}$, $EQE_{peak2}$, and $EQE_{peak3}$, and the EQE peaks $EQE_{peak1}$, $EQE_{peak2}$, and $EQE_{peak3}$ of the adjacent EQE spectra SP1, SP2, and SP3 may have an interval of, for example, about 200 nm, and within the above range, about 1 nm to about 200 nm, about 1 nm to about 180 nm, about 1 nm to about 160 nm, about 1 nm to about 150 nm, 1 nm to about 130 nm, about 1 nm to about 120 nm, about 1 nm to about 100 nm, about 1 nm to about 90 nm, about 1 nm to about 80 nm, about 1 nm to about 70 nm, about 1 nm to about 60 nm, about 1 nm to about 50 nm, about 1 nm to about 40 nm, about 1 nm to about 30 nm, or about 1 nm to about 20 nm.

The adjacent EQE spectra SP1, SP2, and SP3 may cross one another at boundaries B12 and B23, and for example, the boundaries B12 and B23 may be a point corresponding to a half of each interval between the peaks $EQE_{peak1}$, $EQE_{peak2}$, and $EQE_{peak3}$ of the adjacent EQE spectra SP1, SP2, and SP3. The boundaries B12 and B23 may be, for example, a reference line dividing the adjacent EQE spectra SP1, SP2, and SP3, and the adjacent EQE spectra SP1, SP2, and SP3 may be separated by the boundaries B12 and B23. EQE at the boundaries B12 and B23 may be 0% to about 5% of the EQE peaks $EQE_{peak1}$, $EQE_{peak2}$, and $EQE_{peak3}$ and within the above range, 0% to about 4%, about 0% to about 3%, about 0% to about 2%, or about 0% to about 1% and substantially, about 0%.

EQE at each peak of the EQE spectra SP1, SP2, and SP3 may be the same or different from one another, and EQE of at least a portion of the EQE spectra SP1, SP2, and SP3 may be about 40% to about 100%, about 50% to about 100%, about 60% to about 100%, about 70% to about 100%, or about 80% to about 100%.

In the drawing, three EQE spectra SP1, SP2, and SP3 are shown as an example but, in a particular (or, alternatively, predetermined) wavelength region (e.g., at least a portion of about 380 nm to 3000 nm), may be, for example, a quantity of EQE spectra that is greater than or equal to 3, greater than or equal to 5, greater than or equal to 7, greater than or equal to 10, greater than or equal to 30, greater than or equal to 50, greater than or equal to 70, greater than or equal to 80, greater than or equal to 100, greater than or equal to 150, greater than or equal to 200, greater than or equal to 250, greater than or equal to 300, greater than or equal to 350, greater than or equal to 400, greater than or equal to 450, or greater than or equal to about 500 and for example, less than or equal to 10000. As the number (e.g., quantity) of the EQE spectra SP1, SP2, and SP3 is increased, each of the EQE spectra SP1, SP2, and SP3 may have a narrower FWHM.

The number (e.g., quantity) of the EQE spectra SP1, SP2, and SP3 may be controlled (e.g., at least partially defined) by an interval (a length, distance, etc.) between the first electrode 110 (reflective layer) and the second electrode 120 (semi-transmissive layer) of the organic photodiode 100 (e.g., in a vertical direction extending perpendicular to the upper surface 40s of the semiconductor substrate 40). For example, as the first electrode 110 (reflective layer) and the second electrode 120 (semi-transmissive layer) have a larger interval (a longer length), the number (e.g., quantity) of the EQE spectra SP1, SP2, and SP3 (e.g., the quantity of EQE spectra exhibited by the organic photodiode 100) may be increased. In addition, as the number of the EQE spectra SP1, SP2, and SP3 is increased, each of the EQE spectra SP1, SP2, and SP3 may have a narrower FWHM.

For example, the interval (or the length) between the first electrode 110 (reflective layer) and the second electrode 120 (semi-transmissive layer) may be controlled by (e.g., at least partially defined by) thicknesses of buffer layers 140 and 150, and as the thicknesses of the buffer layers 140 and 150 are thicker, the number (e.g., quantity) of the EQE spectra SP1, SP2, and SP3 (e.g., the quantity of EQE spectra exhibited by the organic photodiode 100) may be increased, and each of the EQE spectra SP1, SP2, and SP3 may have a narrower FWHM.

For example, the interval (or the length) between the first electrode 110 (reflective layer) and second electrode 120 (semi-transmissive layer) may be controlled by (e.g., at least partially defined by) a thickness of the first buffer layer 140, and as the thickness of the first buffer layer 140 increases, the number (e.g., quantity) of the EQE spectra SP1, SP2, and SP3 (e.g., the quantity of EQE spectra exhibited by the organic photodiode 100) may be increased, and each of the EQE spectra SP1, SP2, and SP3 may have a narrower FWHM.

For example, the thickness of the first buffer layer 140 may be much thicker than that of the photoelectric conversion layer 130, for example, about 10 times or more, about 20 times or more, about 30 times or more, about 40 times or more, about 50 times or more, about 70 times or more, or about 100 times or more, for example, about 10 times to about 1000 times, about 20 times to about 1000 times, about 30 times to about 1000 times, about 40 times to about 1000 times, about 50 times to about 1000 times, about 70 times to about 1000 times, or about 100 times to about 1000 times thicker than that of the photoelectric conversion layer 130 (e.g., the thickness of the photoelectric conversion layer 130).

For example, a thickness of the first buffer layer 140 may be greater than or equal to about 400 nm, and within the above range, greater than or equal to about 500 nm, greater than or equal to about 700 nm, greater than or equal to about 900 nm, greater than or equal to about 1000 nm, greater than or equal to about 1200 nm, greater than or equal to about 1400 nm, greater than or equal to about 1500 nm, greater than or equal to about 2000 nm, greater than or equal to about 2500 nm, greater than or equal to about 3000 nm, greater than or equal to about 3500 nm, greater than or equal to about 4000 nm, greater than or equal to about 4500 nm, or greater than or equal to about 5000 nm, and for example less than or equal to about 50 µm, less than or equal to about 45 µm, less than or equal to about 40 µm, less than or equal to about 35 µm, less than or equal to about 30 µm, less than or equal to about 25 µm, less than or equal to about 20 µm, or less than or equal to about 15 µm, within the above range, about 400 nm to about 50 µm, about 500 nm to about 50 µm, about 700 nm to about 50 µm, about 900 nm to about 50 µm, about 1000 nm to about 50 µm, about 1200 nm to about 50 µm, about 1400 nm to about 50 µm, about 1500 nm to about 50 µm, about 2000 nm to about 50 µm, about 2500 nm to about 50 µm, about 3000 nm to about 50 µm, about 3500 nm to about 50 µm, about 4000 nm to about 50 µm, about 4500 nm to about 50 µm, or about 5000 nm to about 50 µm.

For example, the EQE spectra may be distributed in a visible light wavelength region, for example, in a wavelength region of about 380 nm to about 800 nm. For example, the EQE spectra may include at least one first EQE spectrum having an EQE peak (e.g., a first EQE peak) in a wavelength region (e.g., a first wavelength region) of greater than or equal to about 380 nm and less than about 500 nm, at least one second EQE spectrum having an EQE peak (e.g., a second EQE peak) in a wavelength region (e.g., second wavelength region) of about 500 nm to about 600 nm, and at least one third EQE having an EQE peak (e.g., third EQE peak) in a wavelength region (e.g., third wavelength region) greater than about 600 nm and less than or equal to 800 nm.

For example, the interval (or the length) between the first electrode 110 (reflective layer) and the second electrode 120 (semi-transmissive layer) may be controlled by (e.g., at least partially defined by) a thickness of the second buffer layer 150, and as the thickness of the second buffer layer 150 is thicker, the number of the EQE spectra SP1, SP2, and SP3 (e.g., the quantity of EQE spectra exhibited by the organic photodiode 100) may be increased. The description of the thickness of the second buffer layer 150 may be the same as that of the thickness of the first buffer layer 140.

In this way, the number of EQE spectra of the organic photodiode 100 (e.g., the quantity of EQE spectra exhibited by the organic photodiode 100) in a particular (or, alternatively, predetermined) wavelength region may be controlled according to (e.g., at least partially defined by) thicknesses of the buffer layers 140 and 150, and accordingly, the organic photodiode 100 may realize electrical characteristics having a narrow multiband EQE spectrum.

The organic photodiode 100 having such a narrow multiband EQE spectrum may be applied to (e.g., included in) various sensors requiring wavelength separation, for example, an image sensor. The sensor may be, for example, a CMOS sensor and may include, for example, a multispectral image sensor or a hyperspectral image sensor.

Figure 3:
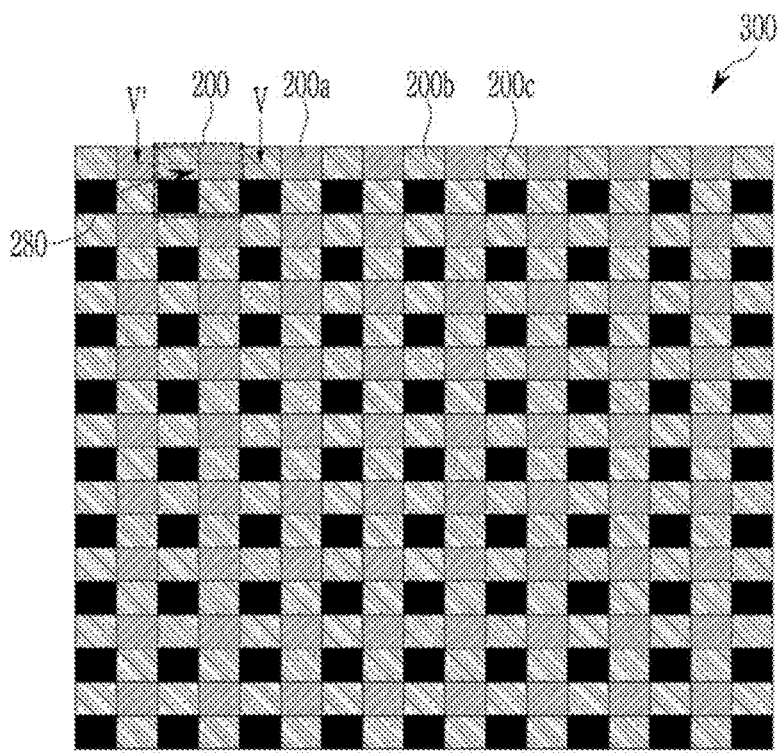
FIG. 3 is a plan view showing an example of a sensor according to some example embodiments.
Figure 4:
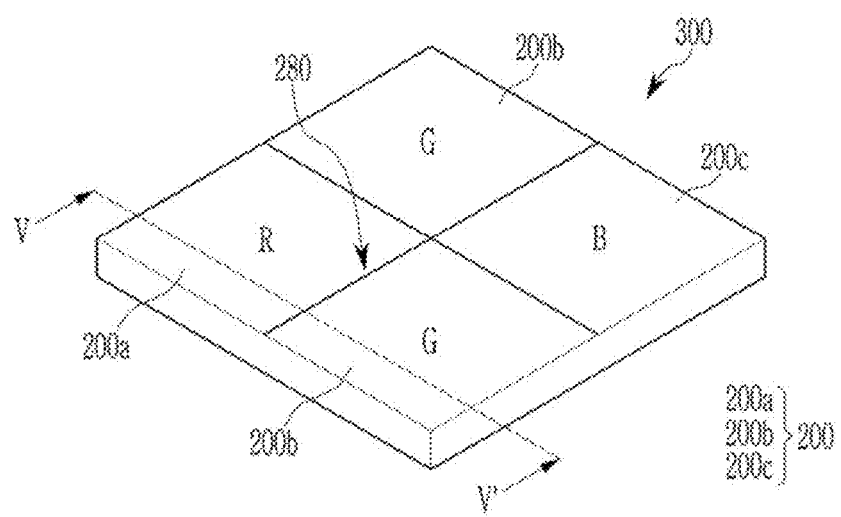
FIG. 4 is a schematic view showing an example of the unit pixel group of FIG. 3.
Figure 5:
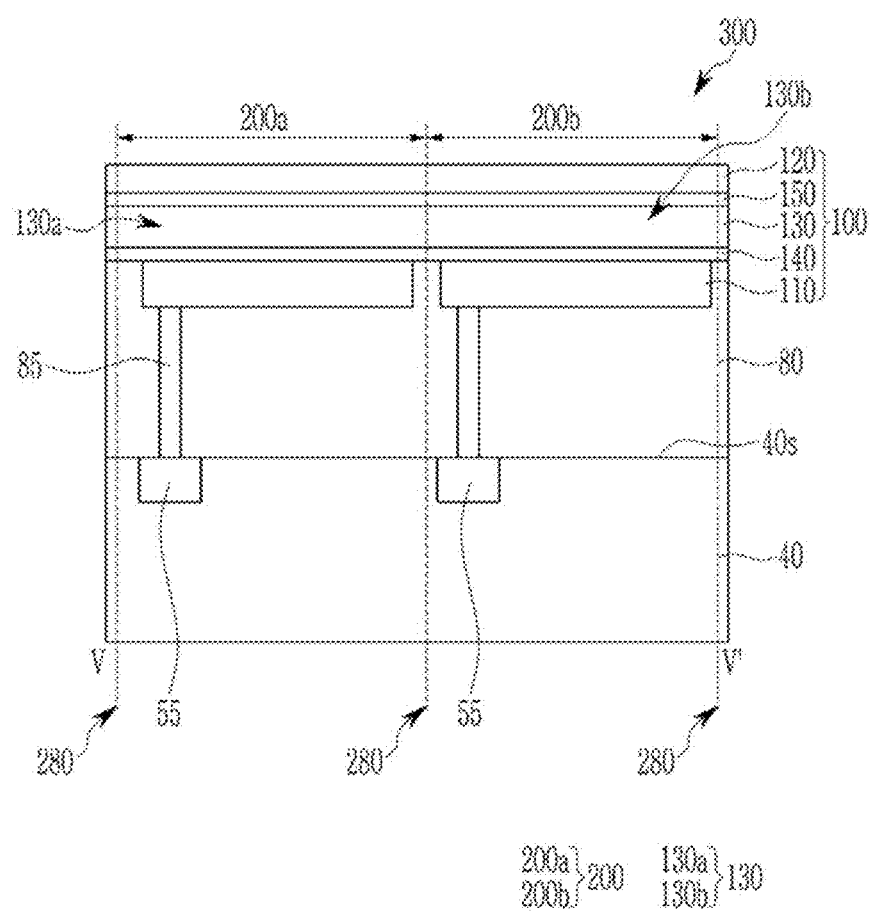
FIG. 5 is a cross-sectional view showing an example of the sensor of FIG. 3 along cross-section view line V-V' of FIGS. 3 and 4.

FIG. 3 is a plan view showing an example of a sensor according to some example embodiments, FIG. 4 is a schematic view showing an example of the unit pixel group 200 of FIG. 3, and FIG. 5 is a cross-sectional view showing an example of the sensor of FIG. 3 along cross-section view line V-V' of FIGS. 3 and 4.

The sensor 300 according to some example embodiments includes a plurality of pixels 200a, 200b, and 200c, and each pixel 200a, 200b, and 200c may be a red pixel 200a selectively sensing light in a red wavelength region, a green pixel 200b selectively sensing light in a green wavelength region, or a blue pixel 200c selectively sensing light in a blue wavelength region. At least one red pixel 200a, at least one green pixel 200b, and at least one blue pixel 200c may form one pixel group 200 and thus be repeatedly arranged along rows and/or columns. Each pixel group 200 may consist of, for example, one red pixel 200a, two green pixels 200b, and one blue pixel 200c but is not limited thereto.

The sensor 300 according to some example embodiments includes a semiconductor substrate 40, an insulation layer 80, and an organic photodiode 100. The organic photodiode 100 may be disposed in each pixel PX.

The semiconductor substrate 40 may be a silicon substrate, and a transmission transistor (not shown) and a charge storage 55 are integrated therein. The charge storage 55 may be integrated for each pixel. The charge storage 55 is electrically connected to the organic photodiode 100 and information of the charge storage 55 may be transferred by a transmission transistor. The semiconductor substrate 40 may not include a separate integrated photodiode such as a silicon photodiode. The insulation layer 80 may include an insulating material including, for example, silicon oxide.

A metal wire (not shown) and a pad (not shown) are also formed on the semiconductor substrate 40. In order to decrease signal delay, the metal wire and pad may be made of a metal having low resistivity, for example, aluminum (Al), copper (Cu), silver (Ag), and alloys thereof, but are not limited thereto. However, the structure is not limited thereto, and the metal wire and the pad may be disposed on the lower portion of the semiconductor substrate 40.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The aforementioned organic photodiode 100 is formed on the insulation layer 80. As described above, the organic photodiode 100 may include a first electrode 110, a second electrode 120, a photoelectric conversion layer 130, and buffer layers 140, and 150. The organic photodiode 100 may optionally further include an anti-reflection layer (not shown) and/or an encapsulant (not shown). The descriptions of the organic photodiode 100 are the same as described above. The organic photodiodes 100 may be arranged along rows and/or columns on the semiconductor substrate 40, for example, in a matrix form.

A focusing lens (not shown) may be further formed on the organic photodiode 100. The focusing lens may control a direction of incident light and gather the light in one region. The focusing lens may have a shape of, for example, a cylinder or a hemisphere, but is not limited thereto.

As shown in FIG. 5, separate pixels 200a, 200b, and 200c may be at least partially defined to include some or all portions of the sensor 300 (e.g., separate, respective portions of the semiconductor substrate 40, insulation layer 80, photoelectric conversion layer 130, buffer layers 140 and 150, second electrode 120, etc.) within respective boundaries 280 extending vertically (e.g., perpendicular to the upper surface 40s of the semiconductor substrate 40) through the sensor 300 and further extending horizontally (e.g., parallel to the upper surface 40s of the semiconductor substrate 40) between adjacent pixels, for example each boundary 280 maybe at least partially defined by separate first electrodes 110 (e.g., separate pixel electrodes) of separate pixels. For example, as shown in FIG. 5, the boundaries 280 between adjacent pixels 200a, 200b, and 200c may be defined in one or more horizontal directions (e.g., one or more directions extending parallel to the upper surface 40s of the semiconductor substrate 40) and extending equidistantly between adjacent first electrodes 110, which may be separate pixel electrodes of separate pixels.

In some example embodiments, separate pixels 200a, 200b, and 200c may include separate photoelectric conversion layers 130, and the boundaries 280 between adjacent pixels may be at least partially defined by the boundaries between adjacent photoelectric conversion layers 130 of adjacent pixels 200a, 200b, and 200c. Separate photoelectric conversion layers 130 of separate pixels 200a, 200b, and 200c may have different compositions and may be configured to selectively absorb and/or photoelectrically convert different wavelength regions of incident light, for example different ones of blue light, green light, red light, infrared light, or any combination thereof. For example, as shown in FIG. 5, pixels 200*a* and 200*b* may include separate, coplanar photoelectric conversion layers 130*a* and 130*b* which are each configured to selectively absorb and/or photoelectrically convert different wavelength regions of light and may include different material compositions, where the boundary 280 between adjacent pixels 200*a* and 200*b* may be at least partially defined by the boundary between the adjacent photoelectric conversion layers 130*a* and 130*b*. For example, the photoelectric conversion layer 130*a* may be configured to selectively absorb and/or photoelectrically convert red light and the photoelectric conversion layer 130*b* may be configured to selectively absorb and/or photoelectrically convert green light. In some example embodiments, separate photoelectric conversion layers of separate pixels (e.g., photoelectric conversion layers 130*a* and 130*b*) are separate portions of a single piece of material, extending between separate pixels, where the separate portions defining separate photoelectric conversion layers (e.g., 130*a* and 130*b*) include different dopants within a base material (e.g., the material represented by Chemical Formula 1) within separate regions of the base material that define one or more boundaries 280 between adjacent pixels.

The sensor 300 according to any of the example embodiments may be applied to various fields requiring wavelength selectivity, and may be applied, for example, as a security sensor, a vehicle sensor, or a biometric sensor. The sensor 300 may be included in a camera, and the sensor 300 or camera may be applied to, for example, an electronic device such as a mobile phone, a digital camera, a display device, a biometric device, a security device, a medical device, and/or an automobile electronic component. However, the present inventive concepts are not limited thereto.

Figure 6:
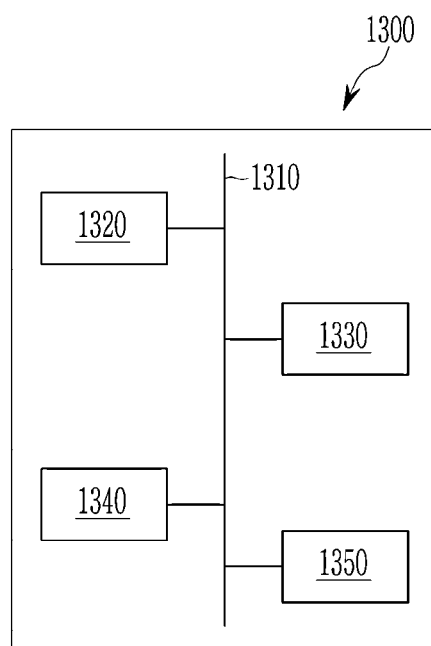
FIG. 6 is a schematic diagram of an electronic device according to some example embodiments.

FIG. 6 is a schematic diagram of an electronic device according to some example embodiments.

Referring to FIG. 6, the electronic device 1300 includes a processor 1320, a memory 1330, a sensor 1340, and a display unit 1350 (e.g., a light emitting diode (LED) display panel device, an organic LED (OLED) display panel device, or the like) electrically connected through a bus 1310. The sensor 1340 may be the aforementioned sensor 300 according to any of the example embodiments. The processor 1320 may perform one or more functions by executing a stored program. The processor 1320 may additionally execute a stored program to display the image on the display unit 1350. The processor 1320 may generate an output.

The memory 1330 may be a non-transitory computer readable medium and may store a program of instructions. The memory 1330 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1320 may execute the stored program of instructions to perform one or more functions. For example, the processor 1320 may be configured to process electrical signals generated by the sensor 1340. The processor 1320 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1320 may be configured to generate an output (e.g., an image to be displayed on the display unit 1350) based on such processing.

Hereinafter, some example embodiments are illustrated in more detail with reference to the following examples. However, the scope of the inventive concepts is not limited to these examples.

Simulation

An organic photodiode is designed to have the following structure, and EQE of the organic photodiode is evaluated through simulation.

Example 1

Lower electrode: Ag reflective electrode with a thickness of 120 nm (reflectance: ≥99.9%@530 nm)
Lower buffer layer: A 510 nm-thick thin film with a refractive index (@530 nm) of 1.8245
Photoelectric conversion layer: A 45 nm-thick blended thin film of an organic light absorbing material ($\lambda_{max}$=540 nm) and fullerene C60
Upper buffer layer: A 36.5 nm-thick thin film with a refractive index 1.7733 (@ 530 nm)
Upper electrode (light incident electrode): A 15 nm-thick Ag semi-transmissive electrode (reflectance: less than 40.0%@530 nm)

Example 2

An organic photodiode is designed according to the same method as Example 1 except that the lower buffer layer has a thickness of 1510 nm.

Example 3

An organic photodiode is designed according to the same method as Example 1 except that the lower buffer layer has a thickness of 10010 nm.

Comparative Example 1

An organic photodiode is designed according to the same method as Example 1 except that an ITO light-transmitting electrode (transmittance: greater than or equal to 80%) is used instead of the Ag semi-transmissive electrode as an upper electrode.

Evaluation I

The organic photodiodes according to Examples and Comparative Examples are evaluated with respect to EQE spectra.

EQE may be calculated by multiply light intensity absorbed in each organic photodiode and IQE (internal quantum efficiency). The light intensity is related to an internal optical E-field, and the internal optical E-field of each layer of an organic photodiode is calculated by using a transfer matrix method (TMM) from a refractive index n, an extinction coefficient k, and a thickness t of each layer and used to calculate light intensity absorbed in each layer in the organic photodiode according to Calculation Equation and MATLAB program disclosed in *Journal of Applied Physics* 86, 487 (1999).

The results are shown in FIGS. 7 to 10.

Figure 7:
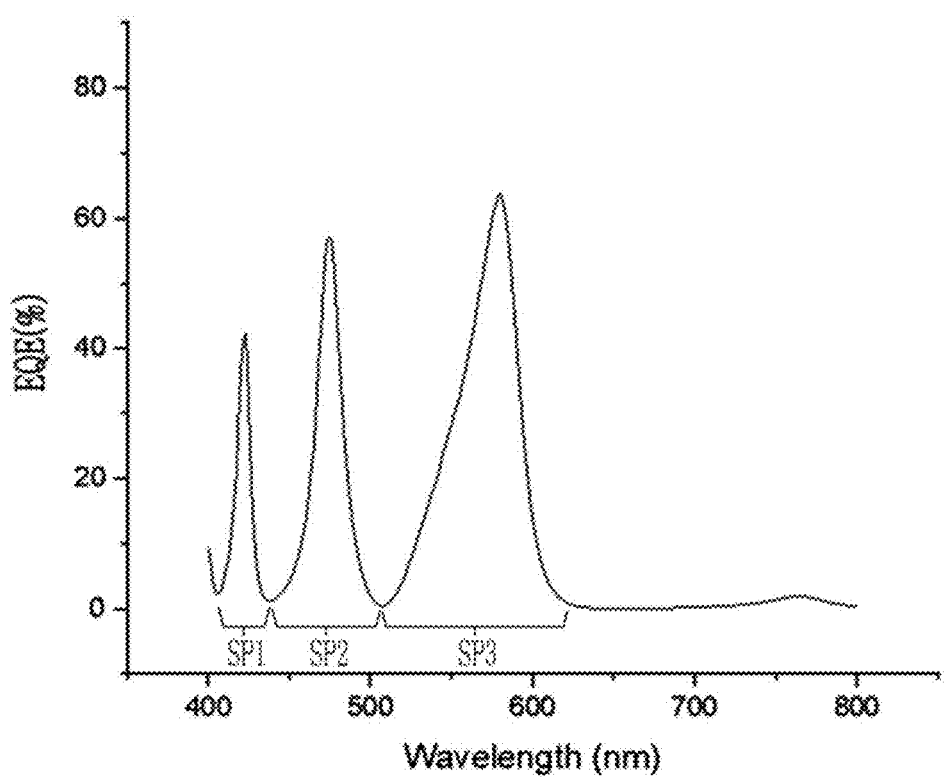
FIG. 7 shows an EQE spectrum of the organic photodiode according to Example 1.
Figure 8:
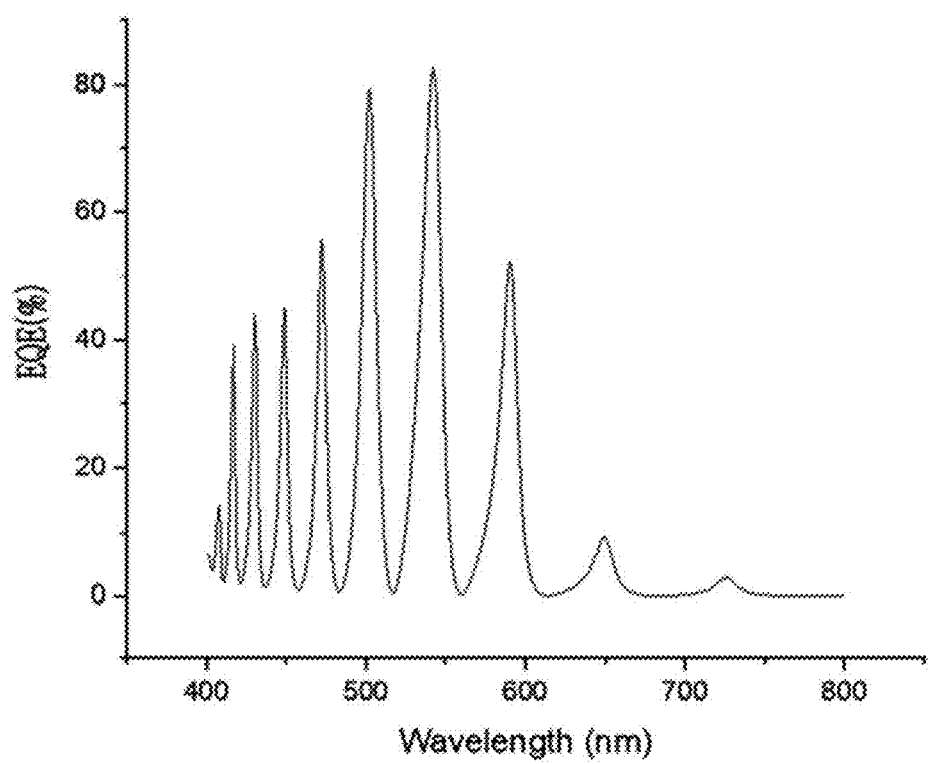
FIG. 8 shows an EQE spectrum of the organic photodiode according to Example 2.
Figure 9:
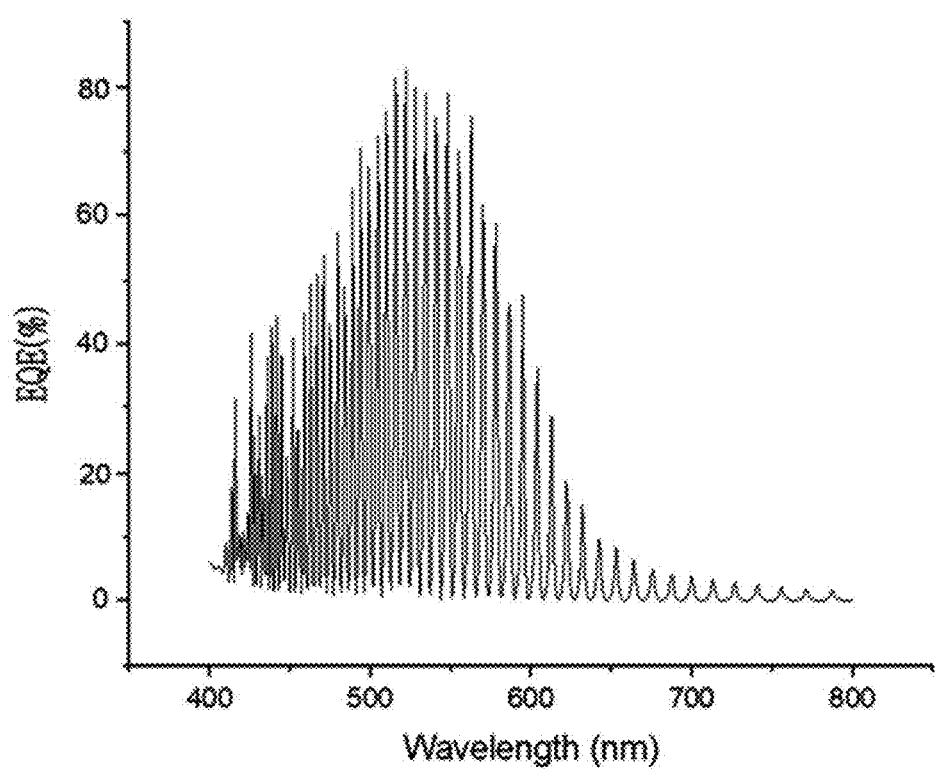
FIG. 9 shows an EQE spectrum of the organic photodiode according to Example 3.
Figure 10:
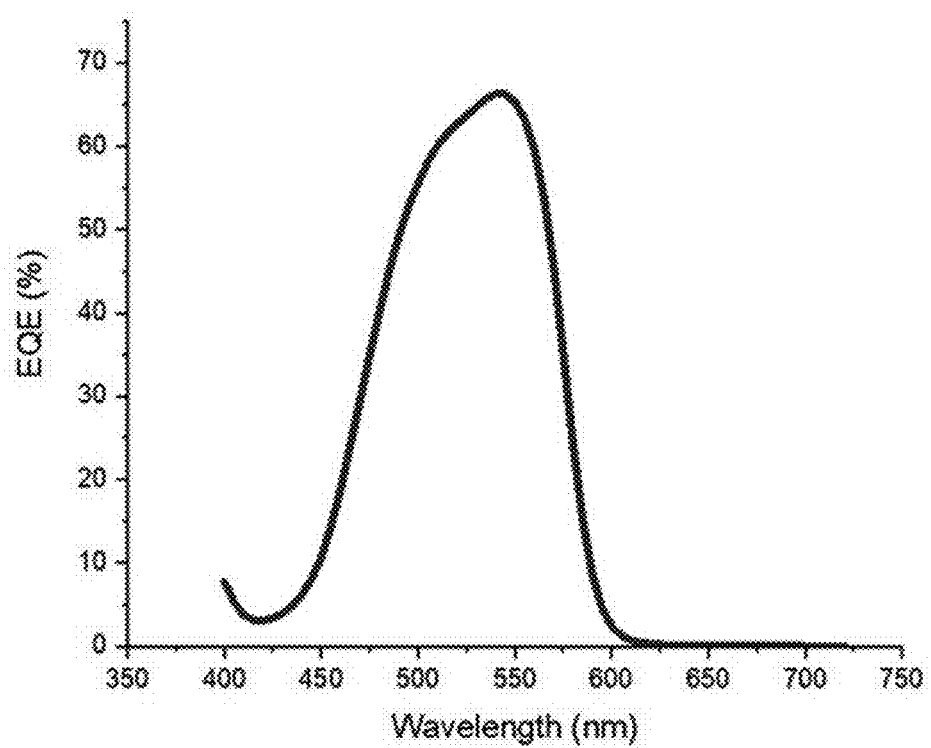
FIG. 10 shows an EQE spectrum of an organic photodiode according to Comparative Example 1.

FIG. 7 shows an EQE spectrum of the organic photodiode according to Example 1, FIG. 8 shows an EQE spectrum of the organic photodiode according to Example 2, FIG. 9 shows an EQE spectrum of the organic photodiode according to Example 3, and FIG. 10 shows an EQE spectrum of an organic photodiode according to Comparative Example 1.

Referring to FIGS. 7 to 10, the organic photodiodes according to Examples 1 to 3 exhibit a plurality of EQE spectra (e.g., SP1, SP2, SP2 in FIG. 7) in a wavelength region of about 380 nm to 800 nm (e.g., as shown in FIGS. 7 to 9), but the organic photodiode according to Comparative Example exhibit a single external quantum efficiency (EQE) spectrum (e.g., as shown in FIG. 10).

In addition, the number (e.g., quantity) of the EQE spectra exhibited by the organic photodiodes according to Examples 1 to 3 is controlled (e.g., at least partially defined) depending on a thickness of a buffer layer, wherein the thicker the buffer layer is, the larger the number the EQE spectra is, and the smaller a full width at half maximum (FWHM) of each EQE spectrum is.

Manufacture of Organic Photodiode

Example 4

Ag is deposited on a glass substrate to form a 120 nm-thick lower electrode (reflective electrode). On the lower electrode, a hole buffer material (a refractive index: 1.7~1.9, hole mobility: $>1 \times 10^{-5}$ cm$^2$/Vs) is deposited to form a 1510 nm-thick lower buffer layer. Subsequently, on the lower buffer layer, a p-type semiconductor (HOMO=5.6 eV, LUMO=3.5 eV, $\lambda_{max}$=540 nm) and an n-type semiconductor C60 are co-deposited in a volume ratio (thickness ratio) of 10:35 to form a 45 nm-thick photoelectric conversion layer. On the photoelectric conversion layer, an electron buffer material (a refractive index: 1.7 to 1.9, electron mobility: $>1 \times 10^{-5}$ cm$^2$/Vs) is deposited to form a 36.5 nm-thick upper buffer layer. On the upper buffer layer, silver (Ag) is thermally deposited to form a 15 nm-thickness upper electrode (semi-transmissive electrode), manufacturing an organic photodiode.

Comparative Example 2

An organic photodiode is manufactured according to the same method as Example 4 except that ITO instead of the silver (Ag) is deposited to form an upper electrode (light-transmitting electrode).

Evaluation II

The organic photodiode according to Example and Comparative Example are evaluated with respect to EQE spectra.

EQE is evaluated in a wavelength region of 380 nm to 800 nm in an Incident Photon to Current Efficiency (IPCE) method, while a reverse bias (reverse bias) of 0 V to 10 V is applied.

The results are shown in FIGS. 11 to 14.

Figure 11:
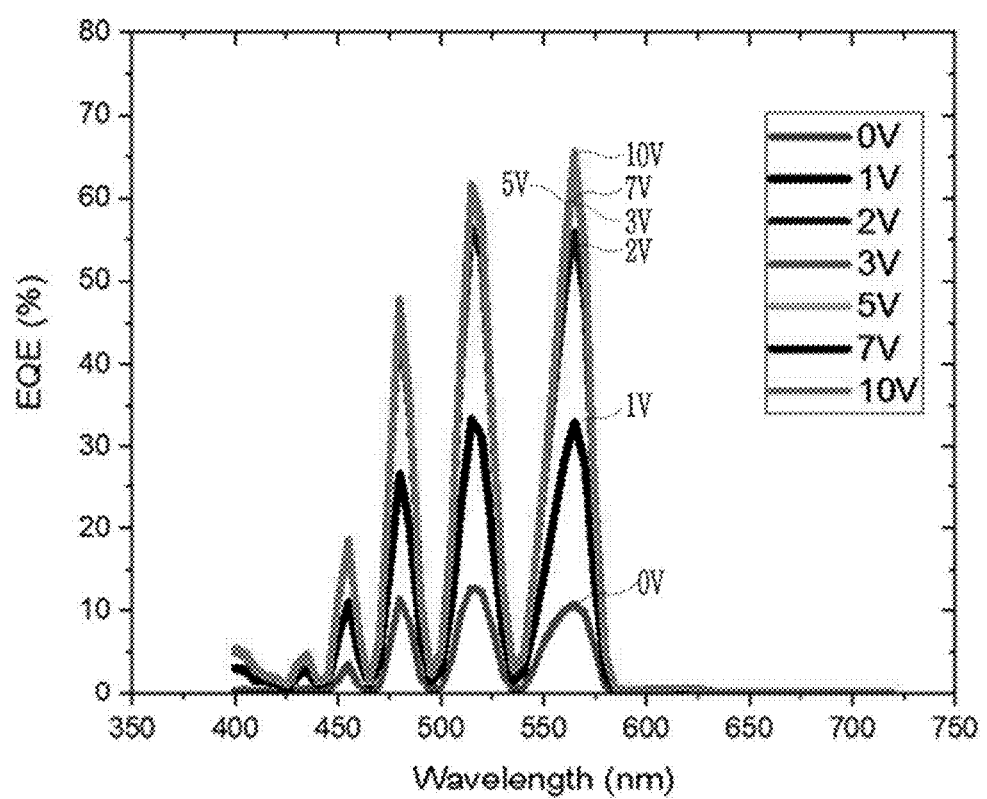
FIG. 11 shows an EQE spectrum according to an applied voltage of the organic photodiode according to Example 4.
Figure 12:
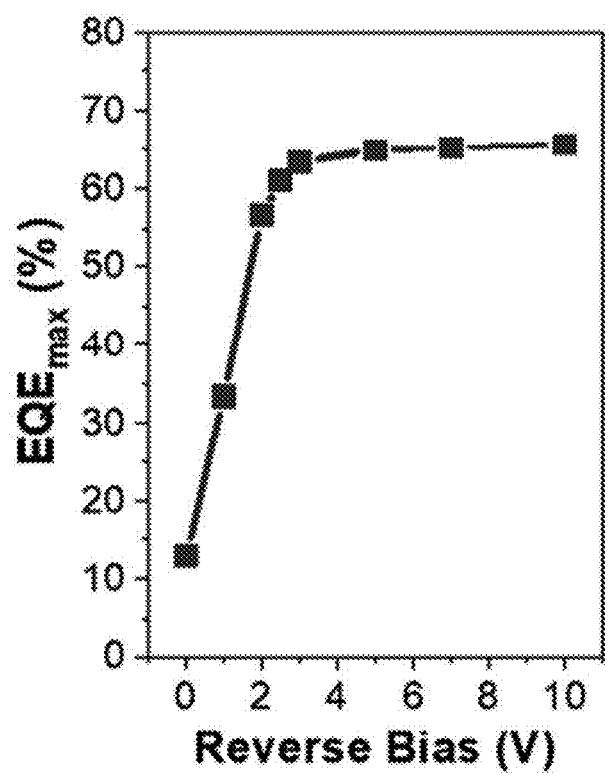
FIG. 12 is a graph showing the maximum external quantum efficiency ($EQE_{max}$) according to the applied voltage in the EQE spectrum of the organic photodiode according to Example 4 of FIG. 11.
Figure 13:
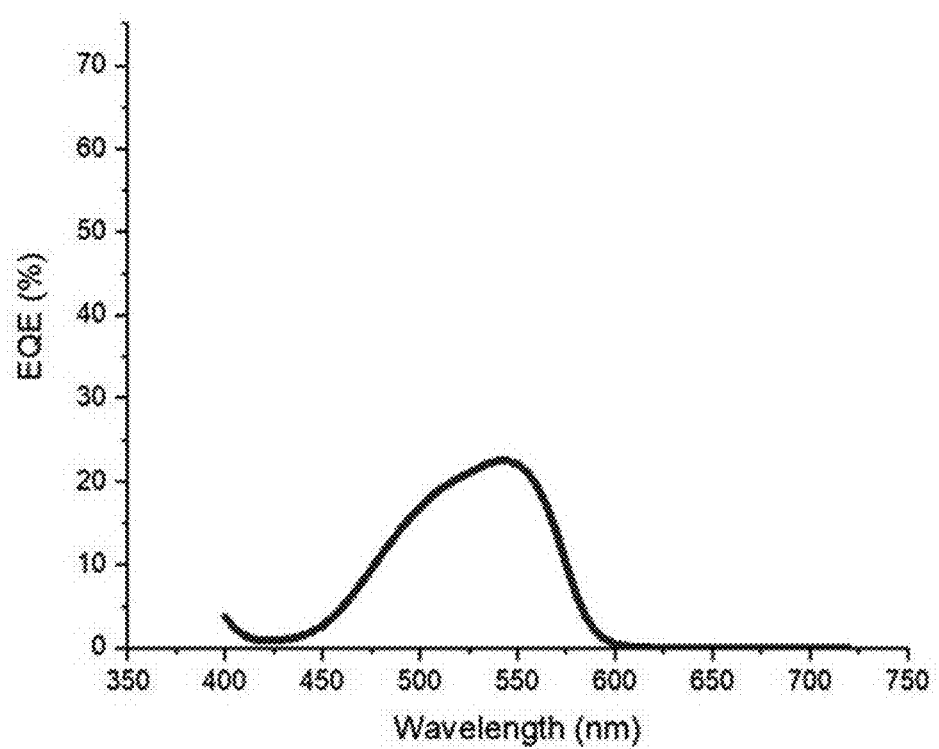
FIG. 13 shows an EQE spectrum according to an applied voltage of the organic photodiode according to Comparative Example 2.
Figure 14:
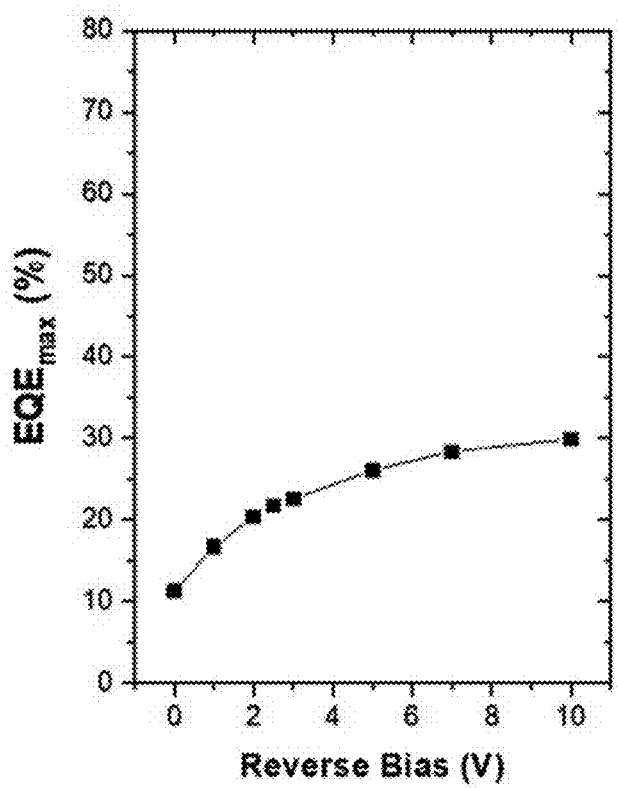
FIG. 14 is a graph showing the maximum external quantum efficiency ($EQE_{max}$) according to the applied voltage in the EQE spectrum of the organic photodiode according to Comparative Example 2 of FIG. 13.

FIG. 11 shows an EQE spectrum according to an applied voltage of the organic photodiode according to Example 4, FIG. 12 is a graph showing the maximum external quantum efficiency ($EQE_{max}$) according to the applied voltage in the EQE spectrum of the organic photodiode according to Example 4 of FIG. 11, FIG. 13 shows an EQE spectrum according to an applied voltage of the organic photodiode according to Comparative Example 2, and FIG. 14 is a graph showing the maximum external quantum efficiency ($EQE_{max}$) according to the applied voltage in the EQE spectrum of the organic photodiode according to Comparative Example 2 of FIG. 13.

Referring to FIGS. 11 to 14, the organic photodiode according to Example 4 exhibit a plurality of EQE spectra in the wavelength region of about 380 nm to 800 nm, but the organic photodiode according to Comparative Example 2 exhibit a single EQE spectrum.

In addition, in the organic photodiode according to Example 4, unlike the organic photodiode according to Comparative Example 2, EQE is increased depending on an applied voltage up to a particular (or, alternatively, predetermined) voltage (about 3 V) but saturated down about 60% or more at the particular (or, alternatively, predetermined) voltage (about 3 V), which is still relatively high.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. An organic photodiode, comprising:
   a first electrode, the first electrode including a reflective layer,
   a second electrode, the second electrode including a semi-transmissive layer,
   a photoelectric conversion layer between the first electrode and the second electrode, the photoelectric conversion layer including an organic light absorbing material, and
   a first buffer layer that is
      between the reflective layer and the photoelectric conversion layer, or
      between the semi-transmissive layer and the photoelectric conversion layer,
   wherein a thickness of the first buffer layer is about 10 times to about 1000 times a thickness of the photoelectric conversion layer.

2. The organic photodiode of claim 1, wherein
   the first buffer layer is between the reflective layer and the photoelectric conversion layer.

3. The organic photodiode of claim 2, wherein the thickness of the first buffer layer is about 400 nm to about 50 μm.

4. The organic photodiode of claim 2, wherein
   the organic photodiode further comprises a second buffer layer between the semi-transmissive layer and the photoelectric conversion layer.

5. The organic photodiode of claim 1, wherein an absorption spectrum of the photoelectric conversion layer is a single absorption spectrum belonging to a red wavelength region, a green wavelength region, a blue wavelength region, an infrared wavelength region, or any combination thereof.

6. A sensor comprising the organic photodiode of claim 1.

7. The sensor of claim 6, wherein the sensor comprises a multi spectral image sensor or a hyperspectral image sensor.

8. A camera comprising the sensor of claim 6.

9. An electronic device comprising the sensor of claim 6.

10. An organic photodiode, comprising:
    a first electrode and a second electrode facing each other; and;
    a photoelectric conversion layer between the first electrode and the second electrode, the photoelectric conversion layer including an organic light absorbing material; and
    a buffer layer,
    wherein the first electrode comprises a reflective layer,
    wherein the second electrode comprises a semi-transmissive layer,
    wherein the buffer layer is between the reflective layer and the photoelectric conversion layer, or between the semi-transmissive layer and the photoelectric conversion layer wherein the photoelectric conversion layer is configured to exhibit a single absorption spectrum within a visible light wavelength region, and wherein a thickness of the buffer layer is about 10 times to about 1000 times a thickness of the photoelectric conversion layer.

11. The organic photodiode of claim 10, wherein the thickness of the photoelectric conversion layer is about 5 nm to about 300 nm, and the thickness of the buffer layer is about 400 nm to about 50 μm.

12. A sensor comprising the organic photodiode of claim 10.

13. The sensor of claim 12, wherein the sensor comprises a multi spectral image sensor or a hyperspectral image sensor.

14. A camera comprising the sensor of claim 12.

15. An electronic device comprising the sensor of claim 12.

16. An organic photodiode, comprising:

a first electrode and a second electrode facing each other, wherein the first electrode includes a reflective layer and the second electrode includes a semi-transmissive layer;

a photoelectric conversion layer between the first electrode and the second electrode, the photoelectric conversion layer including an organic light absorbing material; and buffer layer that is at least one of between the first electrode and the photoelectric conversion layer, or between the second electrode and the photoelectric conversion layer, wherein the reflective layer and the semi-transmissive layer collectively define a microcavity extending between the reflective layer and the semi-transmissive layer and through the photoelectric conversion layer, wherein a thickness of the buffer layer is about 10 times to about 1000 times a thickness of the photoelectric conversion layer.

17. A sensor comprising the organic photodiode of claim 16.

18. The sensor of claim 17, wherein the sensor comprises a multi spectral image sensor or a hyperspectral image sensor.

19. A camera comprising the sensor of claim 17.

20. An electronic device comprising the sensor of claim 17.

* * * * *